US005534491A

United States Patent [19]

Nakamura et al.

[11] Patent Number: 5,534,491
[45] Date of Patent: Jul. 9, 1996

[54] PROCESS FOR PREPARING A LAYERED STRUCTURE CONTAINING AT LEAST ONE THIN FILM OF OXIDE SUPERCONDUCTOR

[75] Inventors: Takao Nakamura; Michitomo Iiyama, both of Osaka, Japan

[73] Assignee: Sumitomo Electric Industries, Ltd., Osaka, Japan

[21] Appl. No.: 381,278

[22] Filed: Jan. 31, 1995

Related U.S. Application Data

[63] Continuation of Ser. No. 183,265, Jan. 19, 1994, abandoned, which is a continuation of Ser. No. 858,706, Mar. 27, 1992, abandoned.

[30] Foreign Application Priority Data

Mar. 28, 1991 [JP] Japan .................................... 3-089616
Mar. 28, 1991 [JP] Japan .................................... 3-089617

[51] Int. Cl.$^6$ ................................................. H01L 39/24
[52] U.S. Cl. ..................... 505/500; 505/329; 505/330; 505/742; 427/62; 427/419.2; 427/419.3
[58] Field of Search ..................................... 505/329, 330, 505/500, 742; 427/62, 63, 419.2, 419.3

[56] References Cited

U.S. PATENT DOCUMENTS 5,061,687 10/1991 Takada et al. ............................. 505/1

FOREIGN PATENT DOCUMENTS 0410373 1/1991 European Pat. Off. .
0467777 1/1992 European Pat. Off. .
64-38917 2/1989 Japan .

OTHER PUBLICATIONS

Kwo et al, "Observations of quasi–particle tunneling and Josephson behavior in YlBa2Cu3O7–x/native barrier/PB thin film junctions", Applied Physics Letters, vol. 56, No. 8, 19 Feb. 1990, pp. 788–790.
Gurvitch et al, "Preparation and substrate reactions of superconducting Y–Ba–Cu–O films", Applied Physics Letters, vol. 51, No. 13, 28 Sep. 1987, pp. 1027–1029.
Pargellis et al, "All–high Tc Josephson tunnel junction: Ba1–xKxBlO3/Ba 1–xKxBiO3 junctions", Applied Physics Letters, vol. 58, No. 1, 7 Jan. 1991, pp. 95–96.
Sobolewski et al, "Cleaning of $YBa_2Cu_3O_{7-x}$ surfaces by thermal oxidation treatments", AIP No. 200 (Boston, MA) 1989 pp. 197–204.
Kirlyakov et al, Superconductivity 3(6), Jun. 1990, pp. 1057–1064.

Primary Examiner—Roy V. King
Attorney, Agent, or Firm—Kerkam, Stowell, Kondracki & Clarke; John C. Kerins

[57] ABSTRACT

A process for producing a layered structure containing at least one thin film of oxide superconductor (1) such as $Y_1Ba_2Cu_3O_{7-x}$ having a contaminated surface on a substrate (3). The contaminated surface of the thin film of oxide superconductor is heat-treated in an atmosphere containing oxygen of high purity of higher than 5N and a partial pressure of 25 Torr at a temperature of 350° to 700° C. On the thin film of oxide superconductor (1), another thin film (2) of oxide superconductor or non-superconductor is deposited.

The resulting structure of layered thin films is used for fabricating superconducting transistor, Josephson junctions, superconducting circuits or the like.

14 Claims, 1 Drawing Sheet

PROCESS FOR PREPARING A LAYERED STRUCTURE CONTAINING AT LEAST ONE THIN FILM OF OXIDE SUPERCONDUCTOR

This application is a continuation of application Ser. No. 08/183,265, filed Jan. 19, 1994, which is a continuation of application Ser. No. 07/858,706, filed Mar. 27, 1992, both of them now abandoned.

BACKGROUND OF THE INVENTION

1. Field of the Invention

The present invention relates to improvement in a process for preparing a layered structure containing at least one thin film of oxide superconductor, more particularly, it relates to a process for cleaning a surface of a bottom superconductor layer.

In first preferred embodiment, the process is used for depositing more than one thin film of oxide superconductor each possessing a different crystal orientation successively on a substrate.

In second preferred embodiment, the process is used for depositing a top superconducting layer on a bottom superconductor layer.

2. Description of the Related Art

Oxide superconductors are expected to be used in a variety of applications due to their higher critical temperatures than conventional metal superconductors. In fact, Y—Ba—Cu—O oxide superconductor possess the critical temperature above 80 K. and Bi—Sr—Ca—Cu—O and Tl—Ba—Ca—Cu—O oxide superconductors possess that of above 100 K.

These oxide superconductors, however, possess crystal anisotropy in their superconducting properties. In fact, the highest critical current density is observed in a direction which is perpendicular to c-axis of their crystal. From this fact, the direction of crystal must be considered in actual utilization of these oxide superconductors.

When the oxide superconductors are used in superconducting electronics such as superconducting devices or integrated superconducting circuits, it is indispensable to prepare at least one thin film of the oxide superconductors. The problem of crystal anisotropy becomes much server in such thin films of oxide superconductors. For instance, in order to realize high-performance superconducting devices or integrated superconducting circuits, it is requested to prepare two kinds of superconducting wiring lines: one part in which electric current flows in parallel with a surface of substrate and another part in which electric current flows perpendicularly to the surface of substrate. For example, in superconducting electrodes, current flows in parallel with the surface of substrate while, in interlayer connecting superconducting wiring lines which connect layers stratified on the substrate, current flows perpendicularly to the surface of substrate. Therefor, when oxide superconductor is used in high-performance superconducting devices or integrated superconducting circuits, it is requested to deposit both of c-axis orientated thin film of oxide superconductor in which the critical current density along the direction which is in parallel with the surface of substrate is higher than the other directions and of a-axis (or b-axis) orientated thin film of oxide superconductor in which the critical current density along the direction which is perpendicular to the surface of substrate is higher than the c-axis orientated thin film on a common surface of a substrate. Hereinafter, only a-axis oriented thin film is referred, since electric current flows equally along the direction which is perpendicular to the surface of substrate in a-axis orientated thin film and in b-axis orientated thin film.

In the multi-layered structures for the superconducting devices or integrated superconducting circuits, two layers of a c-axis oriented thin film of oxide superconductor and of an a-axis oriented thin film of oxide superconductor must be deposited successively. Crystal orientation of the thin film of oxide superconductor can be controlled by selecting or adjusting film-forming temperature which is determined by substrate temperature. In fact, the a-axis oriented thin film can be realized at a substrate temperature which is lower by about 50° to 100° C. than a substrate temperature at which the c-axis oriented thin film grows.

In a superconducting junction of so-called Josephson Junction realized with oxide superconductor, it is requested to deposit a bottom superconductor layer, an intermediate thin film of non-superconductor and a top superconductor layer on a substrate successively.

Josephson element is a two-terminals element, so that a logical circuit consisting of Josephson elements alone becomes complicated. In order to overcome this demerit of complexity, a variety of ideas of three-terminals elements are proposed. In the superconductor transistors consisting of superconductor and semiconductor which is a typical three-terminals element, it is also required to combine a thin film of semiconductor with a thin film of oxide superconductor and hence successive deposition of thin films each made of different material is required.

Successive deposition of a thin film of ordinary conductor such as metal on a thin film of oxide superconductor is required also in the other type superconducting element consisting of superconductor and ordinary conductor. In these superconducting elements, a superconducting current passes through a thin film of non-superconductor sandwiched between two layers of superconductors positioned close to each other. A distance between the two adjacent superconductors is determined by the coherence length of superconductor. Since the coherence length of oxide superconductors is very short, the distance between two adjacent superconductors must be several nanometer.

In addition to this, from a point of view as performance of the superconducting devices, all thin films in the superconducting device must have high crystallinity, in other words, these thin films are preferably made of a single crystal or polycrystal having crystal orientation which is similar to single crystal. When the superconducting device has thin film(s) made of polycrystal whose crystal orientation is not well-ordered or has amorphous thin film(s), high-performance of the superconducting device can not be expected and hence function thereof When more than two thin films are deposited successively on a common substrate, it is usual practice to subject a surface of a bottom superconductor layer to cleaning operation before a top superconductor layer is deposited, otherwise electrical continuity between the bottom superconductor layer and the top superconductor layer is spoiled due to contaminants adsorbed on a surface of the bottom superconductor layer or undesirable oxides produced on the surface. Discontinuity of two layers result in formation of a undesirable junction between two layers. Superconducting devices or integrated superconducting circuits having such undesirable junction do not show desired performance and sometimes do not work.

In particular, the surface condition of the bottom superconductor layer should be considered carefully because the coherence length of oxide superconductors is very short. Still more, oxygen of oxide superconductors is rather unstable and easily escape out of the thin film. Excessive oxygen deficient result in deterioration of superconducting properties and, in the worst case, loss of superconductivity.

Therefore, the surface of bottom superconductor layer must be clean and also must have well-ordered crystallinity or superconducting property.

In the field of semiconductor industries, the surface of bottom superconductor layer is often cleaned with ultra-pure water, by chemical washing, dry or wet etching or the like. In the case of oxide superconductors, however, these clearing technique can not be used due to high reactivity of oxide superconductors. If the surface of thin film of oxide superconductor is treated by these known techniques, undesirable reaction occur on the surface, resulting in that cleanness of the surface become worse and crystallinity and superconducting property are lost.

It is also known to deposit the top superconductor layer, just after the bottom superconductor layer of oxide superconductor has been deposited, in an identical apparatus. This technique, however, requires a big apparatus and materials to be used for the top superconductor layer are limited.

An object of the present invention is to solve the problems and to provide an improved process for preparing a layered structure containing at least one thin film of oxide superconductor without deteriorating superconducting properties of the thin film of oxide superconductor.

Another object of the present invention is to provide an improved process for depositing more than one thin film of oxide superconductor each possessing a different crystal orientation successively on a substrate.

Still another object of the present invention is to provide an improved process for depositing, on a thin film of oxide superconductor, another thin film of different material.

SUMMARY OF THE INVENTION

The present invention provide a process for producing a layered structure containing at least one thin film of oxide superconductor having a contaminated surface on a substrate, characterized in that the contaminated surface of the thin film of oxide superconductor is heat-treated in an atmosphere containing oxygen of high purity at a temperature between an evaporation temperature of contaminants and a film forming temperature of the thin film of oxide superconductor before another thin film is deposited on the thin film of oxide superconductor.

An essence of the process according to the present invention resides in that a surface of a bottom superconductor layer is heat-treated in oxygen of high purity so as to clean the surface before another thin film is deposited thereon.

The heat-treatment is effected just before the top superconductor layer of oxide superconductor is deposited on the bottom superconductor layer so that contaminants such as hydrocarbons or metal carbides adsorbed or deposited on he surface of the bottom superconductor layer are removed by the heat-treatment. The heat-treatment permit to repair local surface disorder of crystallinity in the bottom superconductor layer and to supply enough oxygen by the heat-treatment so that superconducting property is improved.

Oxygen of high-purity used in the process of the present invention have preferably a purity of higher than 5 N (99.999%) containing substantially no $H_2O$ and $CO_2$ which react easily with and deteriorate oxide superconductor.

A partial pressure of oxygen during the heat-treatment is preferably between 20 mTorr and 100 Torr.

The heat-treatment is effected at a heating temperature between 350° and 700° C. for a thin film of $Y_1Ba_2Cu_3O_{7-x}$. If the heating temperature is not higher than 350° C., the recrystallized surface of thin film will not reappear and, if the heating temperature exceed 700° C., order of crystal of the thin film of oxide superconductor is disturbed. Time duration of the heat-treatment depend on the partial pressure of oxygen and the heating temperature is usually between several minutes and several hours.

Preferably, the thin film of oxide superconductor is subjected to ultra-high vacuum of lower than $1 \times 10^{-9}$ Torr before the heat-treatment is effected.

The substrate is preferably a single crystal of oxide such as MgO, $StTiO_3$, $PrGaO_3$ or the like.

The thin film of oxide superconductor can be a bottom superconductor layer which is deposited directly on a surface of the substrate. This bottom superconductor layer can be a thin film of oxide superconductor, for example, a c-axis oriented thin film of $Y_1Ba_2Cu_3O_{7-x}$.

The process according to the present invention is applicable to any known oxide superconductors and is advantageously applicable to Y—Ba—Cu—O oxide superconductor, Bi—Sr—Ca—Cu—O oxide superconductor and Tl—Ba—Ca—Cu—O oxide superconductor which have the most attractive properties including their high critical temperatures.

First Embodiment

In a preferred first embodiment of the present invention, another thin film is made of oxide superconductor which may be made of the same material as or different material from the bottom superconductor layer. In this case, another thin film can be an a-axis oriented thin film of $Y_1Ba_2Cu_3O_{7-x}$.

Namely, in the first embodiment, the present invention provides a process for depositing a first thin film of an oxide superconductor and a second thin film of oxide superconductor successively, crystal orientation of the first thin film being different from that of the second thin film, and the first thin film having a contaminated surface, characterized in that the contaminated surface of the first thin film is heated in an atmosphere containing oxygen of high purity at a temperature between an evaporation temperature of contaminants and a film forming temperature of the first thin film before second thin film is deposited.

In the first embodiment, the process according to the present invention is applicable for laminating or stratifying thin films of oxide superconductor each having a different crystal orientation successively and, more particularly, is advantageously applicable for depositing an a-axis oriented thin film of oxide superconductor on a c-axis oriented thin film of oxide superconductor.

Second Embodiment

In a preferred second embodiment of the present invention, the present invention provides a process for depositing, on a first thin film of oxide superconductor whose surface is contaminated, a second thin film made of different material from the oxide superconductor, characterized in final the first thin film of oxide superconductor is heated in an atmosphere containing oxygen of high purity at a temperature between an evaporation temperature of contaminants and a film forming temperature of the first thin film before the second thin film is deposited. In this case, the second thin film can be made of non-superconductor, for example insulator such as MgO or metal such as Ag. A third thin film of oxide superconductor can be deposit additionally on the second thin film.

The second embodiment of the process according to the present invention is applicable for depositing, on a thin film of oxide superconductor, a thin film of insulator or ordinary conductor in order to fabricate superconducting devices.

In both embodiments, the process according to the present invention is applicable, for example, to such a thin film of oxide superconductor which is exposed to air and hence whose surface is deteriorated, in order to clean the surface before another thin film or top superconductor layer having a different crystal orientation or of different material is deposited thereon, so that more than two thin film layers each having a different crystal orientation or a combination of a thin film of oxide superconductor and a non-superconductor can be deposited in different film forming apparatuses independently at their optimum conditions and hence the resulting layered thin films show an improved superconducting property.

In conclusion, the present invention provides a process for stratifying more than one thin film of oxide superconductor each having different orientation without spoiling superconducting property. The process according to the present invention also permits to deposit, on a thin film of oxide superconductor, another thin film of different material without spoiling superconducting property. The obtained stratified thin films show improved crystallinity and improved continuity or matching in lattice constants at their interface which are requested for realizing superconducting elements or integrated superconducting circuits from which high-performance superconducting devices are fabricated.

BRIEF DESCRIPTION OF THE DRAWING

FIG. 1A shows a substrate 3 on which thin films are to be deposited successively by the process according to the present invention.

Figure 1A:
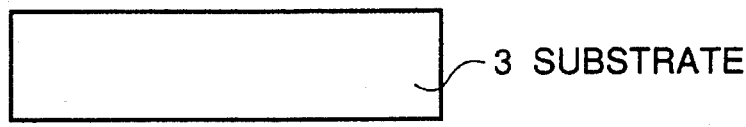
FIGS. 1A, 1B, 1C and 1D illustrate successive steps for preparing a layered structure containing at least one thin film of oxide superconductor by the process according to the present invention.
Figure 1B:
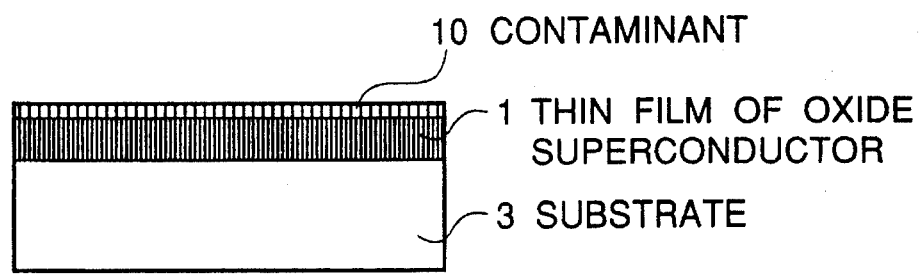

At first, a thin film of oxide superconductor (1) is deposited on the substrate (3) by off-axis sputtering method, laser abrasion method, reaction evaporation method, MBE or CVD technique. After deposition complete, the substrate (3) having the deposited thin film of oxide superconductor (1) is taken out of a sputtering chamber. In air, a surface of the thin film of oxide superconductor (1) reacts with moisture to produce a deteriorated portion (10) thereon and is contaminated with hydrocarbons, $BaCO_3$, $BaCuO_2$ or the like as is shown in FIG. 1B.

Then, the substrate (3) is placed in a ultra-high vacuum chamber which is then vacuumed lower than $1 \times 10^{-9}$ Torr. After that, the thin film of oxide superconductor (1) is heat-teated under suitable operational conditions. The surface of the thin film of oxide superconductor (1) is monitored by a quadrupole mass spectrometer (QMS) and is analyzed by means of a low energy electron diffraction analyzer (LEED) or a X-ray photoelectron spectrometer (XPS) after the heat-treatment, in such a manner that contaminants are removed, deteriorated portion (10) disappears and a crystalline surface is exposed.

Figure 1C:
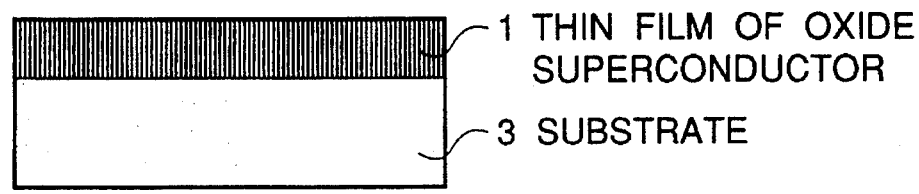
Figure 1D:
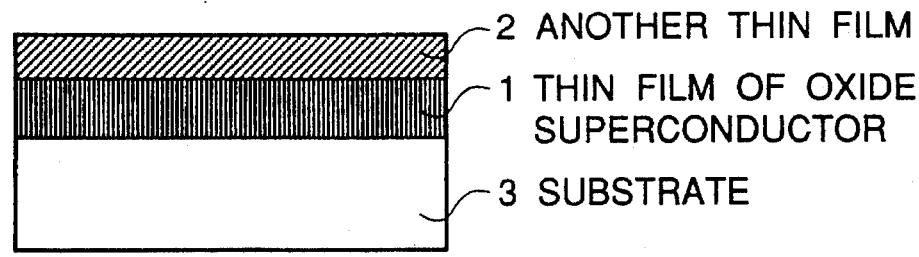

On the resulting cleaned surface (FIG. 1C), another thin film (2) (oxide superconductor or different material) is deposited in the same chamber by off-axis sputtering method, laser abrasion method, reaction evaporation method, MBE, CVD technique or the like.

DESCRIPTION OF THE PREFERRED EMBODIMENT

Now, the present invention will be described with referring to Example but the scope of the invention should not be limited thereto.

Example 1

In this Example 1, an a-axis oriented thin film of oxide superconductor of $Y_1Ba_2Cu_3O_{7-x}$ was deposited on a c-axis oriented thin film of oxide superconductor of $Y_1Ba_2Cu_3O_{7-x}$ by the process according to the present invention whose steps are illustrated in FIG. 1. At first, a c-axis oriented thin film of oxide superconductor of $Y_1Ba_2Cu_3O_{7-x}$ (1) having a thickness of 300 nm is deposited on a substrate (3) of MgO (100) by off-axis sputtering method under following operational conditions:

| Sputtering gas | Ar | 90% |
| --- | --- | --- |
|  | $O_2$ | 10% |
| Pressure |  | 10 Pa |
| Substrate temperature |  | 700° C. |

After deposition complete, the substrate (3) is taken out of a sputtering chamber. A surface of the resulting thin film of oxide superconductor (1) has a deteriorated portion (10) thereon and is contaminated with hydrocarbons, $BaCO_3$, $BaCuO_2$ or the like produced by a reaction with moisture in air.

Then, the substrate (3) is placed in a ultra-high vacuum chamber which is then vacuumed lower than $1 \times 10^{-9}$ Torr.

After that, the thin film of oxide superconductor (1) is heat-teated under following operational conditions:

| Atmosphere | $O_2$ (purity of more than 5N, partial pressure of 25 Torr) |
| --- | --- |
| Heating temperature | 600° C. (substrate temperature) |
| Heating time | 10 min (after then, quenched in oxygen atmosphere) |

The surface of the thin film of oxide superconductor (1) is monitored by a quadropole mass spectrometer (QMS) and is analyzed by means of a low energy electron diffraction analyzer (LEED) or a X-ray photoelectron spectrometer (XPS) in order to confirm that contaminants or deteriorated portion (10) are removed and disappear and a crystalline surface is exposed.

On the resulting cleaned surface (FIG. 1C), an a-axis oriented thin film of oxide superconductor of $Y_1Ba_2Cu_3O_{7-x}$ (2) having a thickness of 200 nm is deposited by off-axis sputtering method under following operational conditions:

| Sputtering gas | Ar | 90% |
| --- | --- | --- |
|  | $O_2$ | 10% |
| Pressure |  | 10 Pa |
| Substrate temperature |  | 600 to 650° C. |

In the layered thin films prepared by this Example 1, it is confirmed that both of the bottom superconductor layer and the top superconductor layer possess improved crystallinity and show continuity at an interface between them.

Example 2

Example 1 is repeated except that a thin film of MgO of the same thickness is deposited on the c-axis oriented thin film of oxide superconductor of $Y_1Ba_2Cu_3O_{7-x}$ in place of the a-axis oriented thin film of oxide superconductor of $Y_1Ba_2Cu_3O_{7-x}$.

In this Example 2, a thin film of MgO (2) having a thickness of 200 nm is deposited by evaporation method under following operational conditions:

| | |
|---|---|
| Pressure | 10 Pa |
| Substrate temperature | 200° C. |

In the layered thin films prepared by Example 2 also, it is confirmed that both of the bottom superconductor layer and the top superconductor layer possess improved crystallinity and show a sharp boundary at their interface.

Example 3

Example 2 is repeated except that the thin film of MgO is replaced by a thin film of Ag of the same thickness.

The thin film of Ag having a thickness of 200 nm is deposited by evaporation method under following operational conditions:

| | |
|---|---|
| Pressure | 10 Pa |
| Substrate temperature | 200° C. |

In the layered thin films prepared by Example 3 also, it is confirmed that both of the bottom superconductor layer and the top superconductor layer possess improved crystallinity and show good contact between two materials.

We claim:

1. A process for producing a layered structure on a film of a $YBa_2Cu_3$ oxide superconductor having a contaminated surface, said oxide superconductor film being deposited on a substrate, characterized in that said film of oxide superconductor is heat-treated in an atmosphere containing oxygen having a purity higher than 5 N (99.999%) under a background ultra-high vacuum pressure of lower than $1\times10^{-9}$ Torr, wherein a partial pressure of oxygen is between 20 mTorr and 25 Torr, said heat treatment being conducted at a temperature between 350° C. and 700° C. for a time duration of from several minutes to ten minutes before another film is deposited on said film of oxide superconductor.

2. The process set forth in claim 1 wherein said substrate is a single crystal.

3. The process set forth in claim 1 wherein said film of oxide superconductor is an bottom superconductor layer which is deposited directly on a surface of a substrate.

4. The process set forth in claim 3 wherein said bottom superconductor layer is a film of oxide superconductor.

5. The process set forth in claim 4 wherein said bottom superconductor layer is a c-axis oriented film of a $YBa_2Cu_3$ oxide.

6. The process set forth in claim 1 wherein said another film also is made of oxide superconductor.

7. The process set forth in claim 6 wherein said another film is an a-axis oriented thin film of a $YBa_2Cu_3$ oxide.

8. The process set forth in claim 1 wherein said another film is made of non-superconductor.

9. The process set forth in claim 8 wherein said another film is a thin film of MgO or Ag.

10. The process set forth in claim 8 wherein a third film of oxide superconductor is further deposited on said another film.

11. A process for depositing a first film of a $YBa_2Cu_3$ oxide superconductor and a second film of oxide superconductor successively on a substrate, a crystal orientation of said first film being different from that of said second film, and said first film having a contaminated surface, characterized in that said contaminated surface of said first film is heat-treated in an atmosphere containing oxygen having a purity higher than 5 N (99.999%) under a background ultra-high vacuum pressure of lower than $1\times10^{-9}$ Torr, and an oxygen partial pressure between 20 mTorr and 25 Torr, said heat treatment being conducted at a temperature between 350° C. and 700° C. for a time duration of from several minutes to ten minutes before said second film is deposited.

12. The process set forth in claim 11 wherein said first film is made of oxide superconductor of a $YBa_2Cu_3$ oxide and the heat-treatment is effected at a temperature between 350° C. and 700° C.

13. A process for depositing, on a first film of a $YBa_2Cu_3$ oxide superconductor whose surface is contaminated, a second film made of different material from said oxide superconductor, characterized in that said first film of oxide superconductor is heat-treated in an atmosphere containing oxygen having a purity higher than 5 N (99.999%) under a background ultra-high vacuum pressure of lower than $1\times10^{-9}$ Torr, and an oxygen partial pressure between 20 mTorr and 25 Torr, said heat treatment being conducted at a temperature between 350° C. and 700° C. for a time duration of from several minutes to ten minutes before said second film is deposited.

14. The process set forth in claim 13 wherein said first film is made of oxide superconductor of a $YBa_2Cu_3$ oxide and is heated at a temperature between 350° C. and 700° C.

* * * * *

UNITED STATES PATENT AND TRADEMARK OFFICE
CERTIFICATE OF CORRECTION

PATENT NO. : 5,534,491
DATED : July 9, 1996
INVENTOR(S) : NAKAMURA et al

It is certified that error appears in the above-indentified patent and that said Letters Patent is hereby corrected as shown below:

Col. 8, Line 11 (Claim 7, Line 2) "...oriented thin film... should be --...oriented film...--.

Signed and Sealed this

Eleventh Day of February, 1997

*Attest:*

BRUCE LEHMAN

*Attesting Officer*      *Commissioner of Patents and Trademarks*